(12) United States Patent
Chung et al.

(10) Patent No.: US 12,446,237 B2
(45) Date of Patent: Oct. 14, 2025

(54) SEMICONDUCTOR DEVICE

(71) Applicant: Samsung Electronics Co., Ltd., Suwon-si (KR)

(72) Inventors: Hyunsoo Chung, Suwon-si (KR); Young Lyong Kim, Suwon-si (KR); Inhyo Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 313 days.

(21) Appl. No.: 18/180,188

(22) Filed: Mar. 8, 2023

(65) Prior Publication Data

US 2024/0032311 A1 Jan. 25, 2024

(30) Foreign Application Priority Data

Jul. 19, 2022 (KR) .................. 10-2022-0088737

(51) Int. Cl.
*H10B 80/00* (2023.01)
*H10B 41/27* (2023.01)
*H10B 43/27* (2023.01)

(52) U.S. Cl.
CPC ............ *H10B 80/00* (2023.02); *H10B 41/27* (2023.02); *H10B 43/27* (2023.02)

(58) Field of Classification Search
CPC ........ H10B 80/00; H10B 41/27; H10B 43/27
USPC ..................................................... 257/777
See application file for complete search history.

(56) References Cited

U.S. PATENT DOCUMENTS

| | | | |
|---|---|---|---|
| 9,478,487 B2 | 10/2016 | Yang et al. | |
| 10,734,371 B2 | 8/2020 | Park | |
| 10,998,301 B2 | 5/2021 | Kanamori et al. | |
| 11,069,707 B2 | 7/2021 | Tanabe et al. | |
| 11,264,403 B2 | 3/2022 | Yoshimizu | |
| 2021/0296358 A1* | 9/2021 | Kanamori | H01L 25/18 |

FOREIGN PATENT DOCUMENTS

KR    20210025032 A  *  3/2021  ............. H10B 41/35

* cited by examiner

*Primary Examiner* — Phuc T Dang
(74) *Attorney, Agent, or Firm* — Wolf, Greenfield & Sacks, P.C.

(57) ABSTRACT

A semiconductor device includes a peripheral circuit structure including peripheral circuits on a substrate and first bonding pads electrically connected to the peripheral circuits and a cell array structure including memory cells on a semiconductor layer and second bonding pads electrically connected to the memory cells and bonded to the first bonding pads. The cell array structure includes a stacked structure including insulating layers and electrodes, an external connection pad on a surface of the semiconductor layer, a dummy pattern at a same level as the semiconductor layer relative to the substrate, and a photosensitive insulating layer on the semiconductor layer and the dummy pattern. A first thickness of a portion of the photosensitive insulating layer vertically overlapping the external connection pad is greater than a second thickness of another portion of the photosensitive insulating layer vertically overlapping the dummy pattern.

20 Claims, 16 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0088737, filed on Jul. 19, 2022, in the Korean Intellectual Property Office, the entire contents of which are hereby incorporated by reference.

FIELD

The inventive concept relates to a semiconductor device.

BACKGROUND

Electronic systems that provide data storage may utilize semiconductor devices capable of storing high-capacity data. Accordingly, research is ongoing for solutions for increasing the data storage capacity of semiconductor devices. For example, a semiconductor device including three-dimensionally arranged memory cells instead of two-dimensionally arranged memory cells has been proposed as a way of increasing the data storage capacity of the semiconductor device.

SUMMARY

Embodiments of the inventive concept provide a semiconductor device with improved reliability.

A semiconductor device according to some embodiments of the inventive concept may include a peripheral circuit structure comprising peripheral circuits on a semiconductor substrate and first bonding pads electrically connected to the peripheral circuits; and a cell array structure comprising memory cells arranged three-dimensionally on a semiconductor layer and second bonding pads electrically connected to the memory cells and bonded to the first bonding pads. The cell array structure may include a stacked structure comprising insulating layers and electrodes alternately stacked on a first surface of the semiconductor layer; an external connection pad on a lower insulating layer that extends on a second surface of the semiconductor layer; a dummy pattern positioned at a same level as the semiconductor layer relative to the semiconductor substrate; and a photosensitive insulating layer on the semiconductor layer and the dummy pattern, wherein a first thickness of a portion of the photosensitive insulating layer vertically overlapping the external connection pad is greater than a second thickness of another portion of the photosensitive insulating layer vertically overlapping the dummy pattern.

A semiconductor device according to some embodiments of the inventive concept may include a peripheral circuit structure comprising peripheral circuits on a semiconductor substrate and first bonding pads electrically connected to the peripheral circuits; and a cell array structure comprising memory cells arranged three-dimensionally on a semiconductor layer and second bonding pads electrically connected to the memory cells and bonded to the first bonding pads. The cell array structure may include a stacked structure comprising insulating layers and electrodes alternately stacked on a first surface of the semiconductor layer; an external connection pad on a lower insulating layer that extends on a second surface of the semiconductor layer; a dummy pattern positioned at a same level as the semiconductor layer relative to the semiconductor substrate; and an upper insulating layer on the semiconductor layer and the dummy pattern, wherein a first distance from the second surface of the semiconductor layer to an upper surface of the upper insulating layer is greater than a second distance from a surface of the dummy pattern to the upper surface of the upper insulating layer.

A semiconductor device according to some embodiments of the inventive concept may include a peripheral circuit structure comprising peripheral circuits on a semiconductor substrate and first bonding pads electrically connected to the peripheral circuits; and a cell array structure comprising memory cells arranged three-dimensionally on a semiconductor layer and second bonding pads electrically connected to the memory cells and bonded to the first bonding pads. The cell array structure may include a stacked structure comprising insulating layers and electrodes alternately stacked on a first surface of the semiconductor layer; an external connection pad on a lower insulating layer that extends on a second surface of the semiconductor layer; a dummy pattern at a same level as the semiconductor layer relative to the semiconductor substrate; and a first buffer layer, a second buffer layer, and a third buffer layer sequentially stacked on the semiconductor layer and the dummy pattern, wherein the first buffer layer, the second buffer layer, and the third buffer layer include a pad opening therein exposing an upper surface of the external connection pad, wherein the third buffer layer comprises a recess in a portion thereof vertically overlapping the dummy pattern, and wherein a depth of the recess is smaller than a depth of the pad opening, relative to a surface of the third buffer layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, to describe the inventive concept in detail, embodiments according to the inventive concept will be described in detail with reference to the accompanying drawings.

Figure 1:
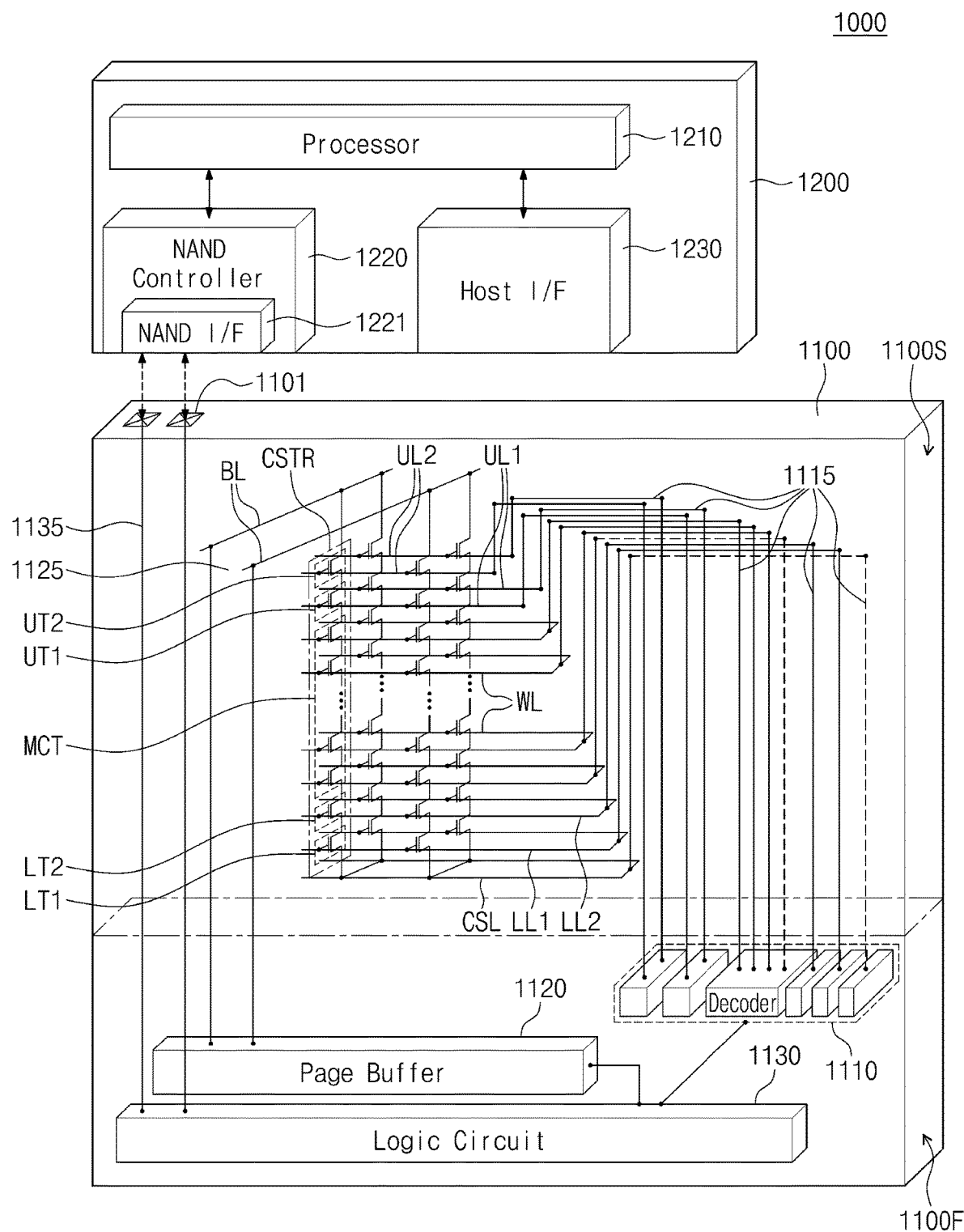
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive device (SSD) device, a universal serial bus (USB), a computing system, a medical device, or a communication device, which include a plurality of semiconductor devices 1100.

The semiconductor device 1100 may be a non-volatile memory device, for example, a NAND flash memory device. The semiconductor device 1100 may include a first structure 1100F and a second structure 1100S on the first structure 1100F. In embodiments, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, and first and second gate lower lines LL1 and LL2, and a memory cell strings CSTR between the bit line BL and the common source line CSL. The terms "first," "second," etc., may be used herein merely to distinguish one element from another. Also, spatially relative terms, such as "below," "lower," "above," "upper," and the like, may be used herein to describe one element's or feature's relationship to another element(s) or feature(s) as illustrated in the figures, as well as different orientations in addition to those depicted in the figures. For example, if the device in the figures is turned over, elements described as "below" or "beneath" other elements or features would then be oriented "above" the other elements or features. Thus, the term "below" can encompass both an orientation of above and below.

In the second structure 1100S, each of the memory cell strings CSTR may include lower transistors LT1 and LT2 adjacent to the common source line CSL and upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to embodiments.

In embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation which erases data stored in the memory cell transistors MCT using a gate induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control the overall operation of the electronic system 1000 including the controller 1200. The processor 1210 may operate depending on a predetermined firmware, and may control the NAND controller 1220 to access the semiconductor device 1100. The NAND controller 1220 may include a NAND interface 1221 for communication with the semiconductor device 1100. The NAND interface 1221 may transmit a control command for controlling the semiconductor device 1100, data to be written in the memory cell transistors MCT of the semiconductor device 1100, data to be read from the memory cell transistors MCT of the semiconductor device 1100, and so forth, through the NAND interface 1221. The host interface 1230 may provide a communication function between the electronic system 1000 and an external host. When receiving a control command from an external host through the host interface 1230, the processor 1210 may control the semiconductor device 1100 in response to the control command.

Figure 2:
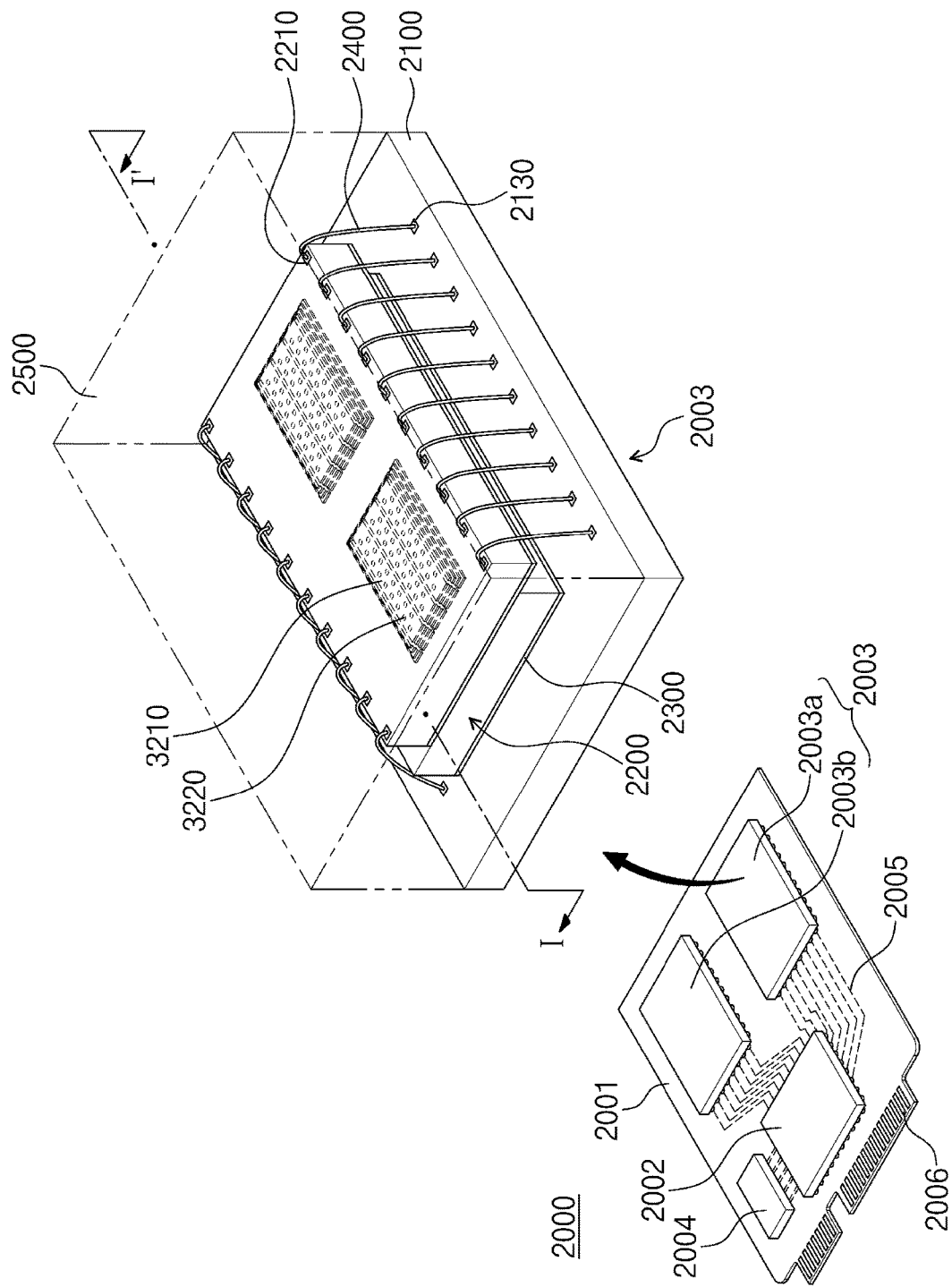
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000 according to an embodiment of the inventive concept may include a main substrate 2001, a controller 2002 mounted on the main substrate 2001, one or more semiconductor packages 2003, and DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the electronic system 2000 and the external host. In embodiments, the electronic system 2000 may communicate with the external host through one or more interfaces, for example, universal serial bus (USB), peripheral component interconnect express (PIC-Express), serial advanced technology attachment (SATA), M-PHY for universal flash storage (UFS), and so forth. In embodiments, the electronic system 2000 may operate with power supplied from an external host through the connector 2006. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for control of the semiconductor package 2003, but a DRAM controller for control of the DRAM 2004.

The semiconductor package 2003 may include a first semiconductor package 2003a and a second semiconductor package 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include stacked structures 3210 and vertical structures 3220. Each of the semiconductor chips 2200 may include a three-dimensional semiconductor memory device as described below.

The connection structures 2400 may be, for example, bonding wires that electrically connect the input/output pads 2210 to the package upper pads 2130. Therefore, in each of the first and second semiconductor packages 2003a and 2003b, the semiconductor chips 2200 may be electrically connected to each other in a wire bonding manner, and may be electrically connected to the package upper pads 2130 of the package substrate 2100. In embodiments, in each of the first and second semiconductor packages 2003a and 2003b, the semiconductor chips 2200 may be electrically connected to each other using through-silicon vias instead of the connection structures 2400 in the wire bonding manner.

In embodiments, the controller 2002 and the semiconductor chips 2200 may be included in one package. In an embodiment, the controller 2002 and the semiconductor chips 2200 may be mounted on a separate interposer substrate other than the main substrate 2001, and may be connected to each other through wirings provided in the interposer substrate.

Figure 3:
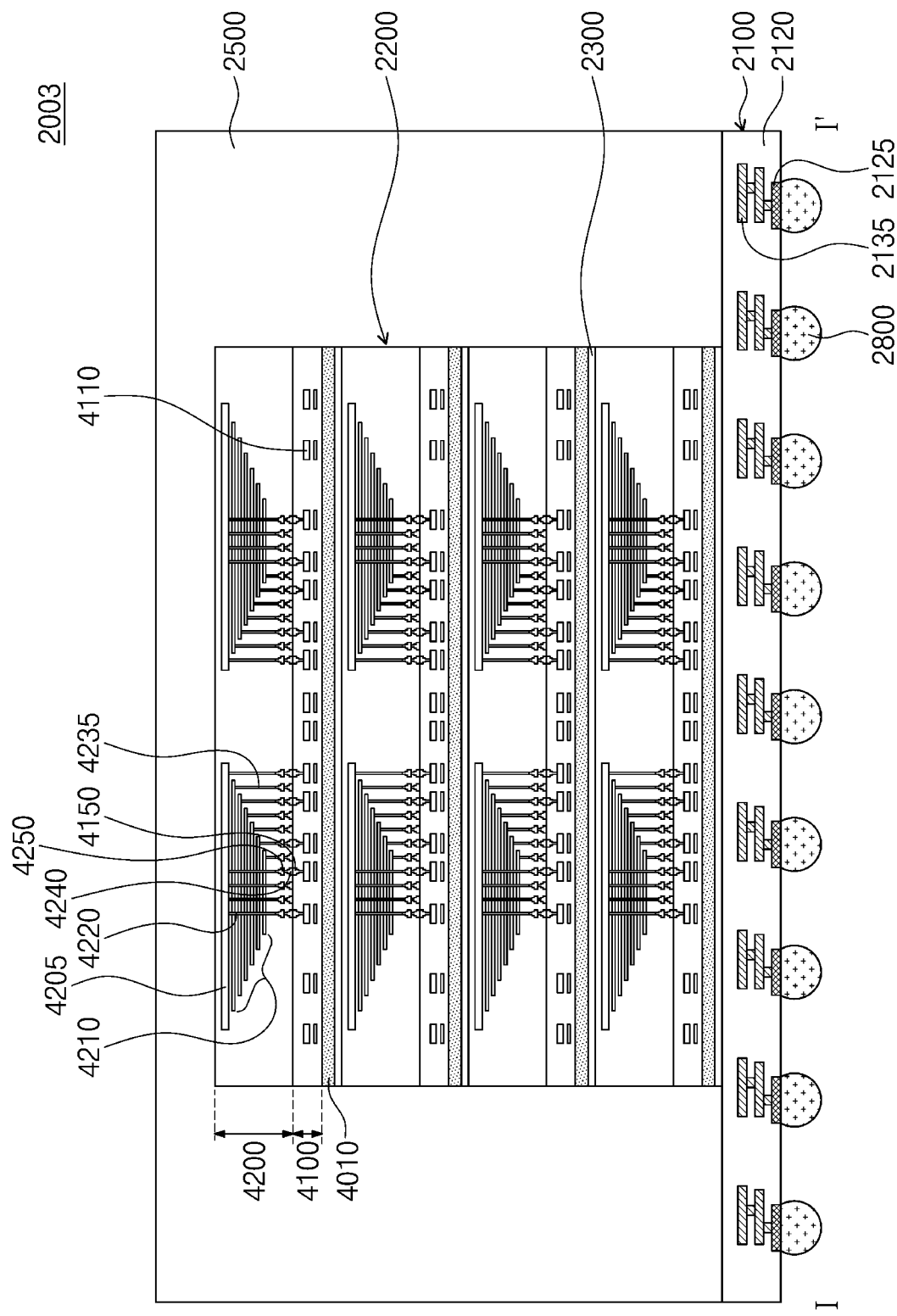
FIG. 3 is a schematic cross-sectional view of semiconductor packages according to an embodiment of the inventive concept.

FIG. 3 is a schematic cross-sectional view of semiconductor packages according to an embodiment of the inventive concept. FIG. 3 illustrates an embodiment of the semiconductor package 2003 of FIG. 2, and conceptually illustrates a region taken along line I-I' of the semiconductor package 2003 of FIG. 2.

Referring to FIG. 3, in a semiconductor package 2003 each of the semiconductor chips 2200 may include a semiconductor substrate 4010, a first structure 4100 on the semiconductor substrate 4010, and a second structure 4200 bonded to the first structure 4100 by a wafer bonding manner on the first structure 4100.

The first structure 4100 may include a peripheral circuit region including the peripheral wiring 4110 and first bonding structures 4150. The second structure 4200 may include a source structure 4205, a stacked structure 4210 between the source structure 4205 and the first structure 4100, vertical structures 4220 and a separation structure passing through the stacked structure 4210, and second bonding structures 4250 electrically connected to the vertical structures 4220 and the word lines (WL of FIG. 1) of the stacked structure 4210, respectively. For example, the second bonding structures 4250 may be electrically connected to the vertical structures 4220 and the word lines (WL of FIG. 1), respectively, through the bit lines 4240 electrically connected to the vertical structures 4220 and the cell contact plugs 4235 electrically connected to the word lines (WL in FIG. 1). The first bonding structures 4150 of the first structure 4100 and the second bonding structures 4250 of the second structure 4200 may be bonded and be in contact with each other. Bonded portions of the first bonding structures 4150 and the second bonding structures 4250 may be formed of, for example, copper (Cu).

Each of the first structure 4100/the second structure 4200/the semiconductor chips 2200 may further include a metal structure according to embodiments described below. Each of the semiconductor chips 2200 may further include an input/output pad (2210 of FIG. 2) electrically connected to the peripheral wirings 4110 of the first structure 4100.

The semiconductor chips 2200 of FIG. 2 may be electrically connected to each other by connection structures 2400 in a form of bonding wire. However, in embodiments, semiconductor chips in one semiconductor package such as the semiconductor chips 2200b of FIG. 3 may be electrically connected to each other by a connection structure including a through silicon via (TSV).

Figure 4:
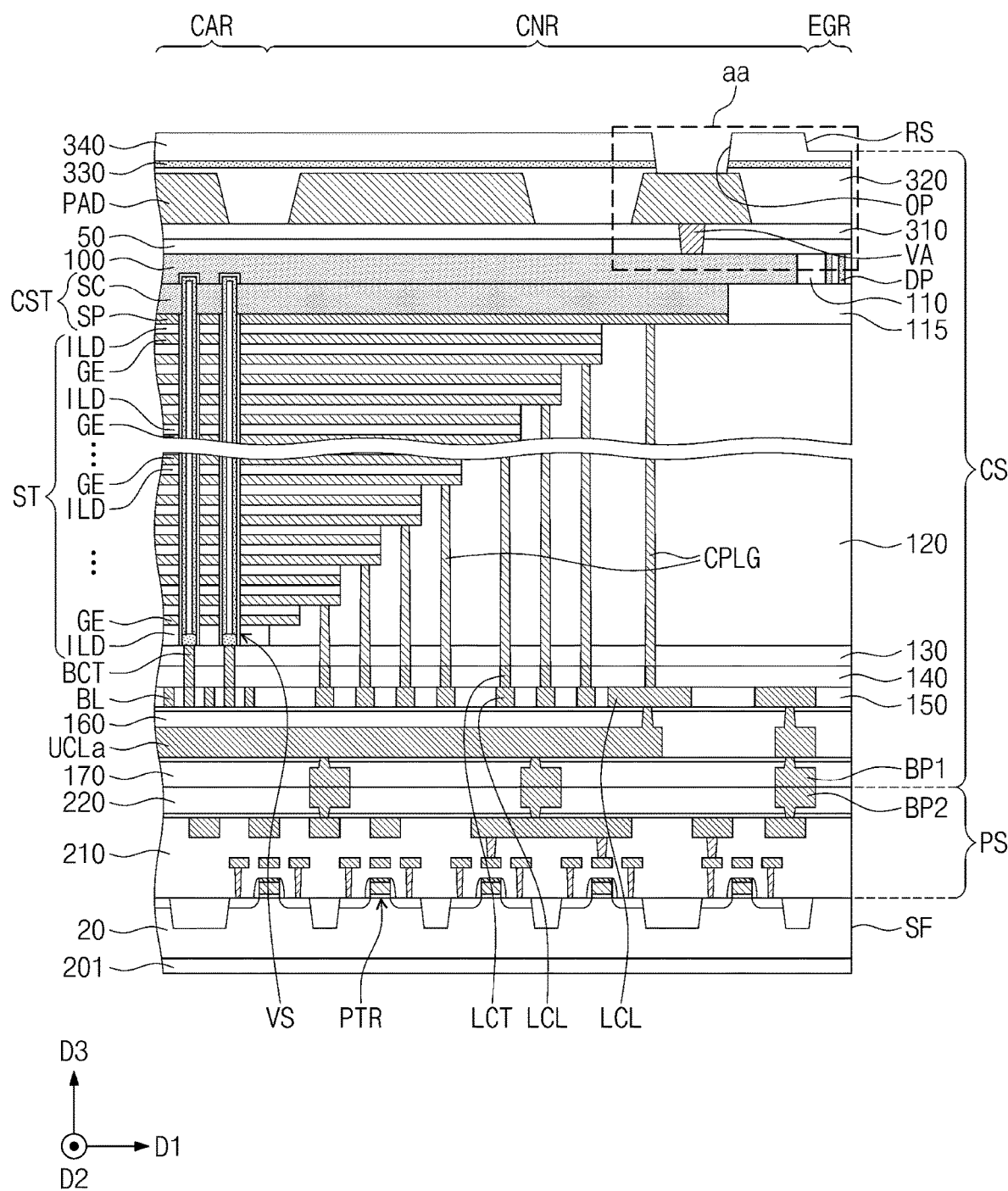
FIG. 4 is a cross-sectional view illustrating a semiconductor device according to embodiments.
Figure 5:
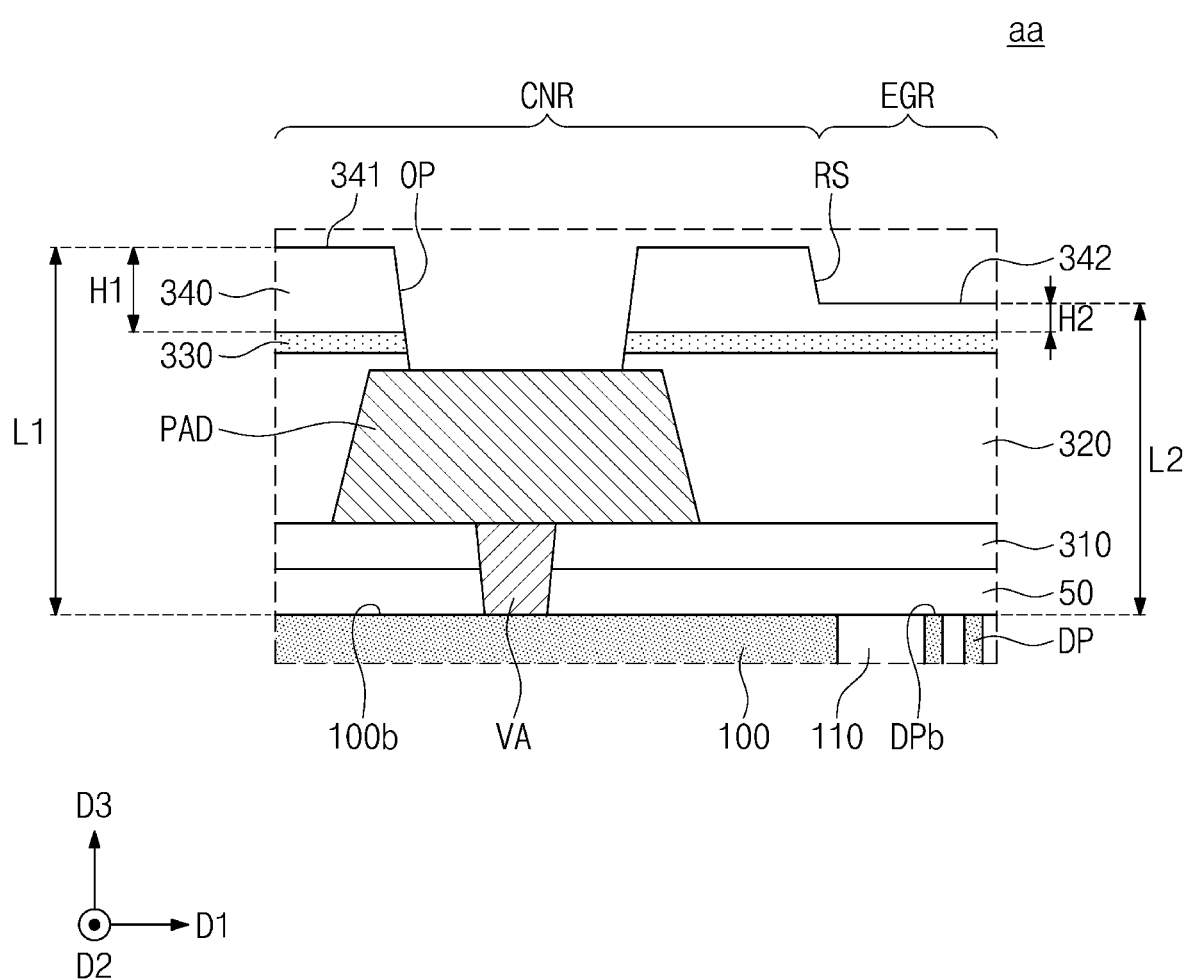
FIG. 5 is an enlarged view of a portion of "aa" of FIG. 4.

FIG. 4 is a cross-sectional view illustrating a semiconductor device according to embodiments. FIG. 5 is an enlarged view of a portion of "aa" of FIG. 4.

A semiconductor device according to the embodiments of the inventive concept may have a chip to chip (C2C) structure. The C2C structure may be provided by manufacturing an upper chip including a cell array structure CS on a first semiconductor substrate 10 (a first wafer), manufacturing a lower chip including a peripheral circuit structure PS on a second semiconductor substrate 20 (a second wafer) different from the first semiconductor substrate 10, and then connecting the upper chip and the lower chip to each other by a bonding manner. For example, the bonding manner may refer to a method of electrically connecting a bonding metal pad formed on an uppermost metal layer of the upper chip and a bonding metal pad formed on an uppermost metal layer of the lower chip to each other. For example, when the bonding metal pad is formed of copper (Cu), the bonding manner may be a Cu-to-Cu bonding manner. The bonding metal pad may also be formed of aluminum (Al) or tungsten (W).

The cell array structure CS may include a memory cell array including memory cells arranged three-dimensionally on a semiconductor layer 100. The memory cell array may be electrically connected to first bonding pads BP1.

In detail, the cell array structure CS may include the semiconductor layer 100, a source structure CST, a stack structure ST, vertical structures VS, bit lines BL, dummy patterns DP, cell contact plugs CPLG, and so forth.

The cell array structure CS may include a cell array region CAR, a connection region CNR, and an edge region EGR. The connection region CNR may be positioned between the cell array region CAR and the peripheral region EGR in a first direction D1.

The semiconductor layer 100 of the cell array structure CS may be disposed on a surface of a first lower insulating layer 50 in the cell array region CAR and the connection region CNR. The semiconductor layer 100 may include a semiconductor doped with dopants having a first conductivity type (e.g., n-type) and/or an intrinsic semiconductor undoped. The semiconductor layer 100 may have a crystal structure including at least one selected from single crystal, amorphous, and polycrystalline. For example, the semiconductor layer 100 may be formed of a polysilicon layer.

The dummy patterns DP may be non-functional elements that are horizontally spaced apart from the semiconductor layer 100 and disposed on the surface of the lower insulating layer 50 in the edge region EGR, which may correspond to a wafer scribe lane region SLR as discussed below. The dummy patterns DP may be spaced apart from each other in the first direction and may be electrically isolated from the semiconductor layer 100. According to some embodiments, a width of each of the dummy patterns DP in the first direction may be smaller than a thickness of each of the dummy patterns DP.

The dummy pattern DP may include the same material as the semiconductor layer 100, and for example, the dummy pattern DP may be formed of polysilicon. The dummy pattern DP may have substantially the same thickness as the semiconductor layer 100. For example, an upper surface of the dummy pattern DP may be positioned at substantially the same level as (e.g., substantially coplanar with) an upper surface of the semiconductor layer 100.

A buried insulating pattern 110 covering a sidewall of the semiconductor layer 100 and a sidewall of each of the dummy patterns DP may be disposed in the connection region CNR and the edge region EGR. The buried insulating pattern 110 may have an upper surface that is substantially coplanar with the upper surface of the semiconductor layer 100 and the upper surface of the dummy pattern DP. The buried insulating pattern 110 may include an insulating material such as silicon oxide.

The source structure CST may be disposed on the semiconductor layer 100. The source structure CST may include a source semiconductor pattern SC and a support semiconductor pattern SP on the source semiconductor pattern SC. The source structure CST may be parallel to the upper surface of the semiconductor layer 100, and may extend in the first direction D1 in parallel to the stack structure ST in the cell array region CAR and the connection region CNR.

The source semiconductor pattern SC may be formed of a semiconductor material doped with dopants having a first conductivity type (e.g., phosphorus (P) or arsenic (As)). For example, the source semiconductor pattern SC may be formed of a polysilicon layer doped with n-type dopants.

The support semiconductor pattern SP may cover an upper surface of the source semiconductor pattern SC, and may include a semiconductor doped with dopants having a first conductivity type (e.g., n-type) and/or an intrinsic semiconductor that is undoped. A concentration of n-type dopants in the support semiconductor pattern SP may be lower than a concentration of n-type dopants in the source semiconductor pattern SC.

An insulating pattern 115 may be disposed on the semiconductor layer 100, the buried insulating pattern 110, and the dummy patterns DP. The insulating pattern 115 may cover a portion of the semiconductor layer 100, the buried insulating pattern 110, and the dummy patterns DP. The insulating pattern 115 may directly contact the source structure CST. When elements or layers are described herein as in "direct" contact or "directly" contacting, no intervening elements or layers may be present.

The stacked structure ST may be disposed on the source structure CST. The stacked structure ST may include electrodes GE and insulating layers ILD that are alternately stacked in a third direction D3 (i.e., a vertical direction) perpendicular to first and second directions D1 and D2 crossing each other.

The electrodes GE may include at least one selected from, for example, a doped semiconductor (e.g., doped silicon, etc.), a metal (e.g., tungsten, copper, aluminum, etc.), a conductive metal nitride (e.g., titanium nitride, tantalum nitride, etc.), a transition metal (e.g., titanium, tantalum, etc.), and so forth. The insulating layers ILD may include a silicon oxide layer and/or a low dielectric layer. In some embodiments, the semiconductor device may be a vertical NAND flash memory device. In this case, the electrodes GE of the stacked structure ST may be used as the gate lower lines LL1 and LL2, word lines WL, and gate upper lines UL1 and UL2 described with reference to FIG. 1.

The electrodes GE may be stacked on the source structure CST to have a stepped structure in the connection region CNR. Each of the electrodes GE may include a pad part in the connection region CNR. The pad parts of the electrodes GE may be positioned at different positions horizontally and vertically. The cell contact plugs CPLG may be respectively connected to pad parts of the electrodes GE.

The plurality of vertical structures VS may pass through the stack structure ST in the cell array region CAR. Each of the vertical structures VS may include a vertical semiconductor pattern and a data storage pattern surrounding a sidewall of the vertical semiconductor pattern. The vertical semiconductor pattern including a semiconductor material may be used as channels of the upper transistors UT1 and UT2, memory cell transistors MCT, and lower transistors LT1 and LT2 described with reference to FIG. 1. The data storage pattern may function as a data storage layer of the NAND flash memory device.

A planar insulating layer 120 may cover the stepped structure of the stacked structure ST. The planar insulating layer 120 may have a substantially flat top surface. The planar insulating layer 120 may include one insulating layer or a plurality of stacked insulating layers. Interlayer insulating layers 130, 140, 150, 160, and 170 may be sequentially stacked on the planar insulating layer 120. The interlayer insulating layers 130, 140, 150, 160, and 170 may include an insulating material such as silicon oxide or silicon nitride.

The bit lines BL may be disposed on the second interlayer insulating layer 140 in the cell array region CAR, and may extend across the stacked structure ST in the second direction D2. The bit lines BL may be electrically connected to the vertical structures VS through bit line contact plugs BCT, respectively.

The cell contact plugs CPLG may pass through the first and second interlayer insulating layers 130 and 140 and the planar insulating layer 120 in the connection region CNR to be respectively connected to the pad parts of the electrodes GE. Vertical lengths of the cell contact plugs CPLG may decrease as the cell contact plugs CPLG are adjacent to the cell array region CAR. Each of the cell contact plugs CPLG may include a barrier metal layer including a conductive metal nitride (e.g., titanium nitride, tantalum nitride, etc.) and a metal layer including a metal (e.g., tungsten, titanium, tantalum, etc.).

Lower conductive lines LCL may be disposed on the second interlayer insulating layer 140 of the connection region CNR, and may be connected to the cell contact plugs CPLG through contact plugs LCT. The third interlayer insulating layer 150 may cover the bit lines BL and the lower conductive lines LCL.

Upper conductive lines UCLa may be disposed in a fourth interlayer insulating layer 160. The upper conductive lines UCLa may be electrically connected to the bit lines BL or the lower conductive lines LCL in the cell array region CAR and the connection region CNR.

The lower conductive line LCL and the upper conductive lines UCLa may be formed of a metal (e.g., tungsten, copper, aluminum, etc.), a conductive metal nitride (e.g., titanium nitride, tantalum nitride, etc.), a transition metal (e.g., titanium, tantalum, etc.), or so forth. For example, the lower conductive lines LCL may be formed of tungsten having a relatively high electrical resistivity, and the upper conductive lines UCLa may be formed of copper having a relatively low electrical resistivity.

The first bonding pads BP1 may be provided in a fifth interlayer insulating layer 170. The first bonding pads BP1 may be electrically connected to the upper conductive lines UCLa. The first bonding pads BP1 may be formed of aluminum, copper, tungsten, or so forth.

The first bonding pads BP1 may be electrically and physically connected to second bonding pads BP2 of the peripheral circuit structure PS by a bonding manner. That is, the second bonding pads BP2 may be in direct contact with the first bonding pads BP1.

The peripheral circuit structure PS may be formed on a second semiconductor substrate 20 and may include peripheral circuits PTR controlling the memory cell array, and peripheral interlayer insulating layers 210 and 220 covering the peripheral circuits PTR. The peripheral circuits PTR may be integrated on an upper surface of the semiconductor substrate 20. A surface insulating layer 201 may be provided on a rear surface of the semiconductor substrate 20.

The peripheral circuits PTR may be row and column decoders, a page buffer, and a control circuit. In more detail, the peripheral circuits PTR may include NMOS and PMOS transistors. Peripheral circuit wirings may be electrically connected to the peripheral circuits PTR through peripheral contact plugs.

The peripheral interlayer insulating layers 210 and 220 may be provided on the upper surface of the second semiconductor substrate 20. The peripheral interlayer insulating layers 210 and 220 may cover the peripheral circuits PTR, the peripheral contact plugs, and the peripheral circuit wirings on the second semiconductor substrate 20. The peripheral contact plugs and the peripheral circuit wirings may be electrically connected to the peripheral circuits PTR. The peripheral interlayer insulating layers 210 and 220 may include a silicon oxide layer, a silicon nitride layer, a silicon oxynitride layer, and/or a low dielectric layer.

The second bonding pads BP2 may be provided in an uppermost peripheral interlayer insulating layer 220 to correspond to positions of the first bonding pads BP1. The second bonding pads BP2 may be electrically connected to the peripheral circuits PTR through the peripheral circuit wirings and the peripheral contact plugs.

The second bonding pads BP2 may include the same metal material as the first bonding pads BP1. The second bonding pads BP2 may have substantially the same shape, the same width, or the same area as the first bonding pads BP1.

As illustrated in FIG. 5, an external connection pad PAD may be disposed on a second lower insulating layer 310 on or covering a surface of the first lower insulating layer 50 of the cell array structure CS. The external connection pad PAD may include a metal material, for example, aluminum. According to some embodiments, the first lower insulating layer 50 and the second lower insulating layer 310 may be formed as or otherwise observed as one single or unitary layer. The first lower insulating layer 50 and the second lower insulating layer 310 may be, for example, silicon oxide layers.

The external connection pad PAD may be electrically connected to the semiconductor layer 100 through a via VA. The via VA may pass through the first lower insulating layer 50 and the second lower insulating layer 310. The external connection pads PAD may be electrically connected to the peripheral circuits PTR of the peripheral circuit structure PS.

A first passivation layer 320, a second passivation layer 330, and a third passivation layer 340 may be sequentially stacked on the second lower insulating layer 310. The first passivation layer 320 may include an insulating material having etch selectivity with the second passivation layer 310. The first passivation layer 320 may include the same insulating material as the first and second lower insulating layers 50 and 310.

For example, the first passivation layer 320 may include a silicon oxide layer, and the second passivation layer 330 may include a silicon nitride layer. The third passivation layer 340 may include a photosensitive insulating layer. In the present specification, the first passivation layer 320, the second passivation layer 330, and the third passivation layer 340 may be referred to as a first upper insulating layer 320, a second upper insulating layer 330, and a third upper insulating layer 340, respectively. Alternatively, the first passivation layer 320, the second passivation layer 330, and the third passivation layer 340 may be referred to as a first buffer layer 320, a second buffer layer 330, and a third buffer layer 340, respectively.

The third passivation layer 340 may include, for example, a polyimide-based material such as photo sensitive polyimide (PSPI).

The first to third passivation layers 320, 330, and 340 may have a pad opening OP exposing at least a portion of an upper surface of the external connection pad PAD in the connection region CNR. In the edge region EGR, the third passivation layer 340 may have a recess RS. In the edge region EGR, a bottom surface 342 of the recess RS may be disposed above an upper surface of the second passivation layer 330. The upper surface of the second passivation layer 330 in the edge region EGR may not be exposed. That is, a depth of the recess RS may be smaller than a depth of the pad opening OP, e.g., relative to the surface 341 of the layer 340 into which the recess RS and the pad opening OP extend.

A first thickness H1 of the third passivation layer 340 in the cell array region CAR and the connection region CNR may be greater than a second thickness H2 of the third passivation layer 340 in the edge region EGR. For example, the first thickness H1 of the third passivation layer 340 that vertically overlaps (e.g., along a line taken in the direction D3) a side surface of the external connection pad PAD may be greater than the second thickness H2 of the third passivation layer 340 that vertically overlaps the dummy pattern DP. The first thickness H1 may be four or more times greater than the second thickness H2. For example, the first thickness H1 may be about 40,000 to 55,000 Angstroms (Å), and the second thickness H2 may be greater than 0 and less than 10,000 Å (1 micrometer (µm)).

A first distance L1 from a surface 100b of the semiconductor layer 100 to an upper surface 341 of the third passivation layer 340 overlapping the semiconductor layer 100 may be greater than a second distance L2 from a surface DPb of the dummy pattern DP to a bottom surface 342 of the recess RS in the third passivation layer 340 overlapping the dummy pattern DP. The second distance L2 to the bottom surface 342 of the recess RS in the third passivation layer 340 may depend on the second thickness H2. A difference between the first distance L1 and the second distance L2 may be 30,000 Å or more.

As illustrated in FIG. 4, in the edge region EGR, the bottom surface 342 of the recess RS may extend to an outermost portion SF of the semiconductor device. That is, the thickness H2 of the third passivation layer 340 at the outermost portion SF of the semiconductor device may be smaller than that at other portions.

Figure 6:
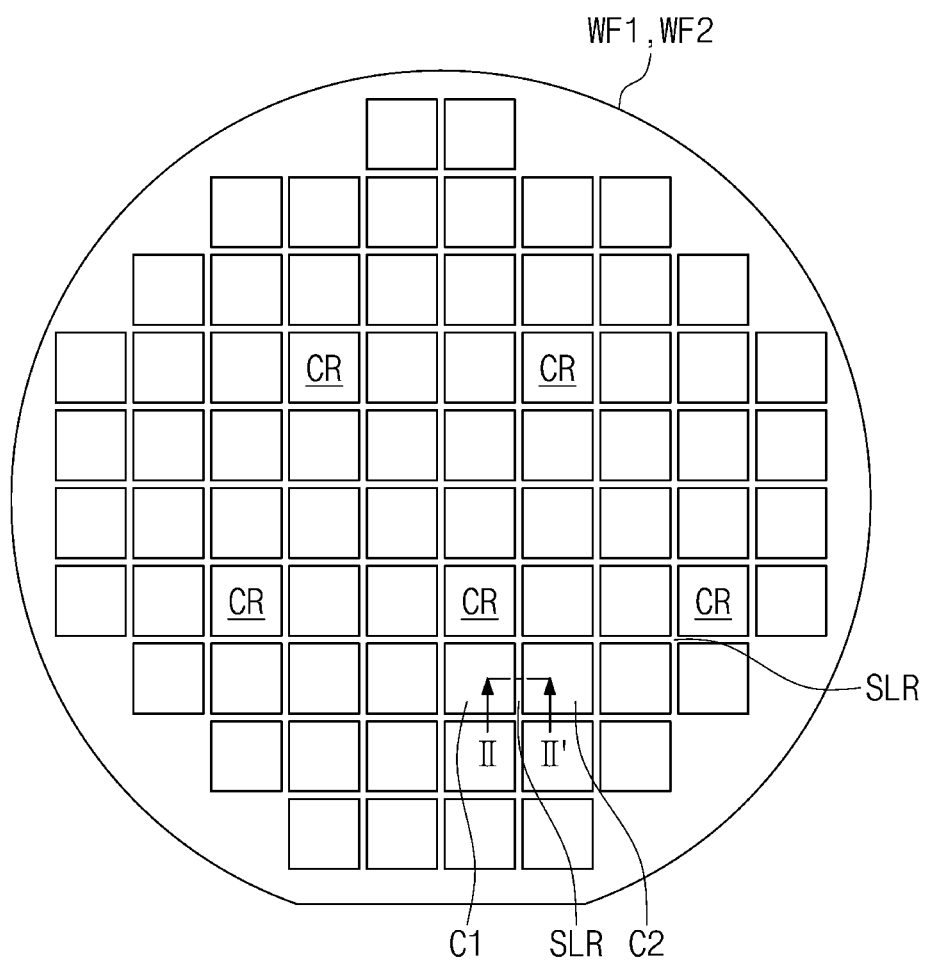
FIG. 6 is a plan view schematically illustrating a stack of wafers.
Figure 7:
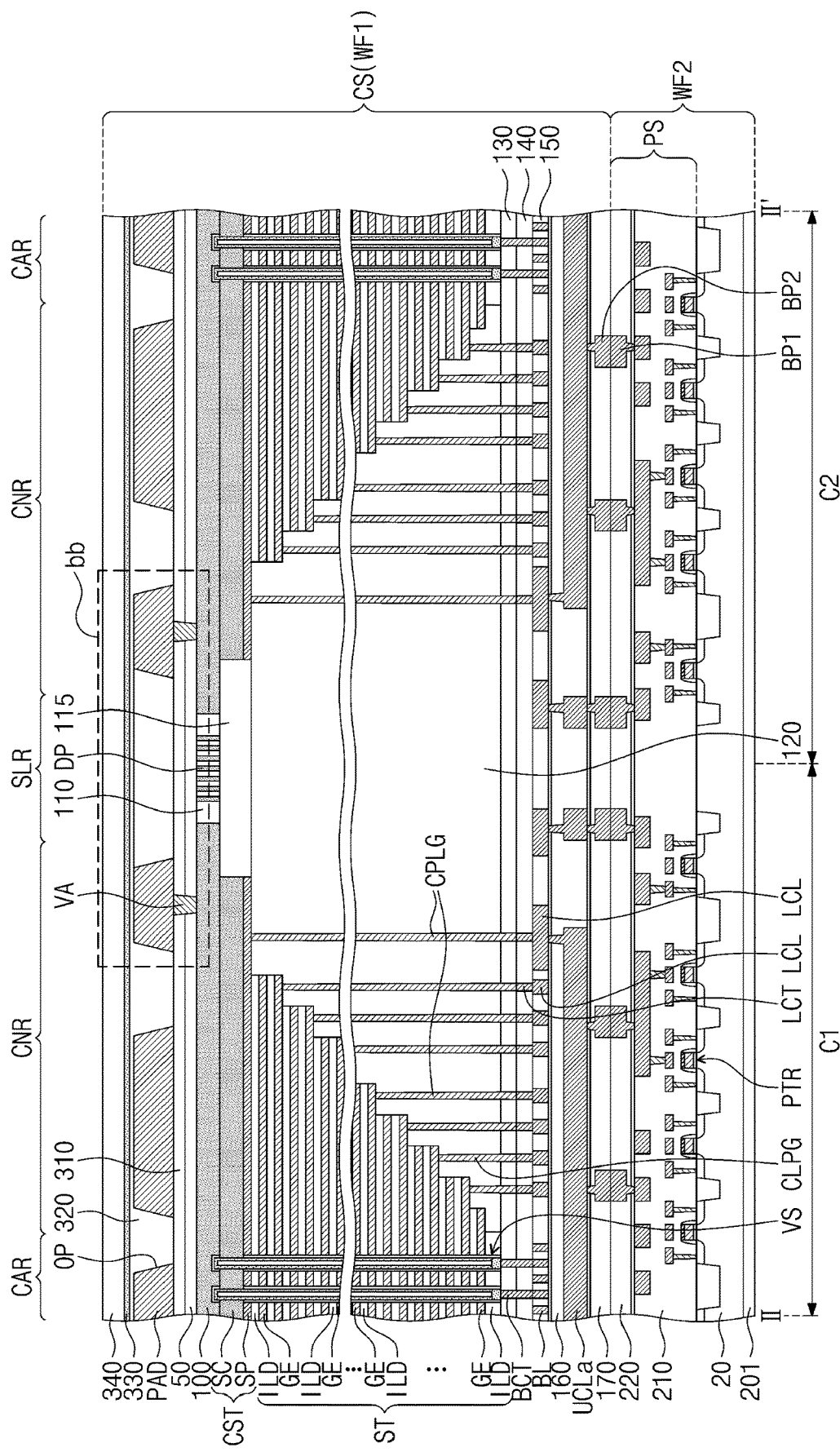
FIG. 7 is a cross-sectional view taken along line II-II' of FIG. 6.

FIG. 6 is a plan view schematically illustrating a stack of wafers. FIG. 7 is a cross-sectional view taken along line II-II' of FIG. 6. FIGS. 8A to 8F are enlarged views of processes corresponding to a portion "bb" of FIG. 7.

Referring to FIGS. 6 and 7, a first wafer WF1 and a second wafer WF2 are prepared, respectively. The first wafer WF1 and the second wafer WF2 each include device regions CR overlapping each other. Each of the device regions CR includes the cell array region CAR and the connection region CNR of FIG. 4. A scribe lane region SLR may be disposed between the device regions CR. The first wafer WF1 may include a configuration of the lower chip described with reference to FIG. 4, and the second wafer WF2 may include a configuration of the upper chip.

The first wafer WF1 includes first bonding pads BP1 disposed on an uppermost portion thereof. The second wafer WF2 includes second bonding pads BP2 disposed on an uppermost portion thereof. The first wafer WF1 is turned over and placed on the second wafer WF2. In this case, the first bonding pads BP1 and the second bonding pads BP2 are brought into contact with each other. Heat and pressure are applied to the first and second wafers WF1 and WF2 to bond the first and second wafers WF1 and WF2.

The device regions CR adjacent to each other of the first and second wafers WF1 and WF2 may be separated, so as to include separate or independent semiconductor devices. For example, a first preliminary region C1 and a second preliminary region C2 may be regions configured to be separated to provide the separate or respective semiconductor devices. The semiconductor layer 100 may be provided in the cell array region CAR and the connection region CNR, and the dummy pattern DP may be provided in the scribe lane region SLR. That is, the scribe lane region SLR may correspond to edge regions EGR of the respective semiconductor devices.

FIGS. 8A to 8F are enlarged views of processes corresponding to a portion "bb" of FIG. 7.

Figure 8A:
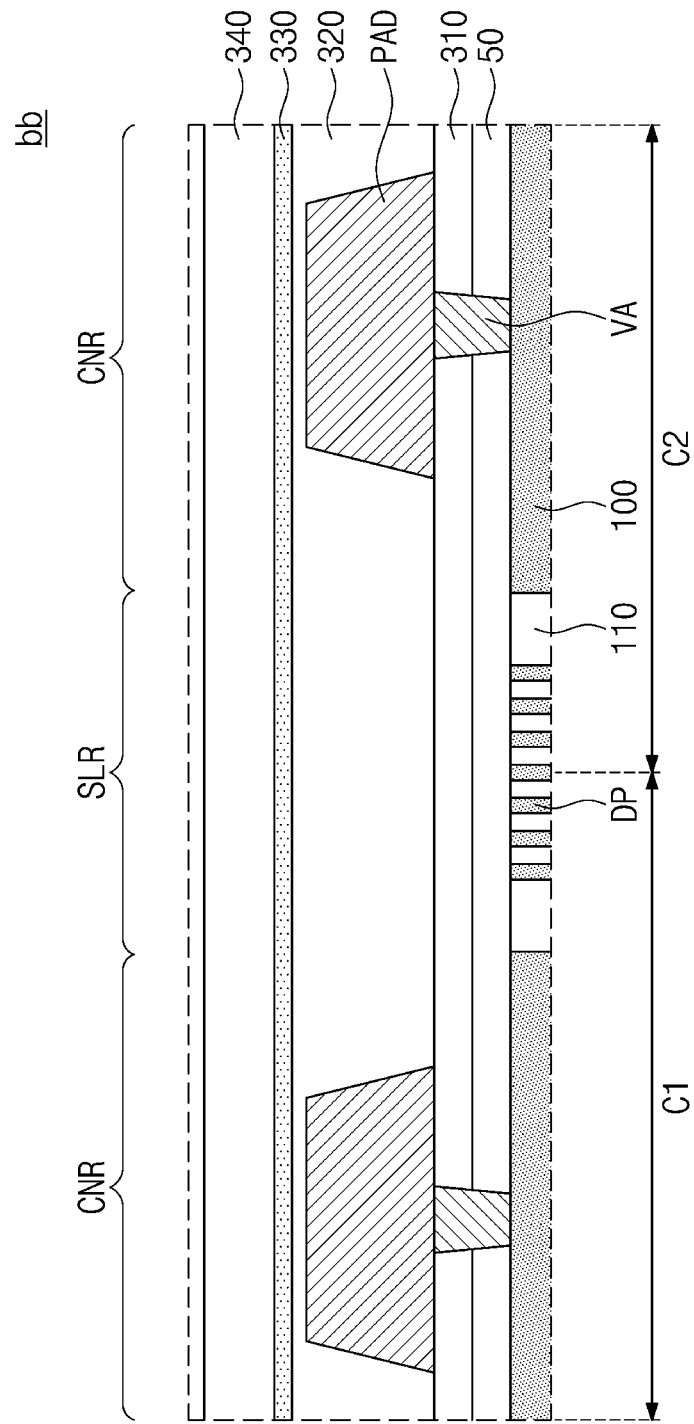
FIGS. 8A, 8B, 8C, 8D, 8E, and 8F are enlarged views of processes corresponding to a portion "bb" of FIG. 7.

Referring to FIGS. 7 and 8A, a first lower insulating layer 50 and a second lower insulating layer 310 are sequentially formed on a semiconductor layer 100 and a dummy pattern DP. According to some embodiments, the first lower insulating layer 50 and the second lower insulating layer 310 may include the same material and may be formed as one (e.g., a single or unitary) layer. A via VA and an external connection pad PAD may be formed, and the via VA may connect the external connection pad PAD to the semiconductor layer 100.

Subsequently, a first passivation layer 320, a second passivation layer 330, and a third passivation layer 340 may be sequentially formed. The first passivation layer 320 and the second passivation layer 330 may be formed using deposition, and the third passivation layer 340 may be formed through a method such as coating.

Figure 8B:
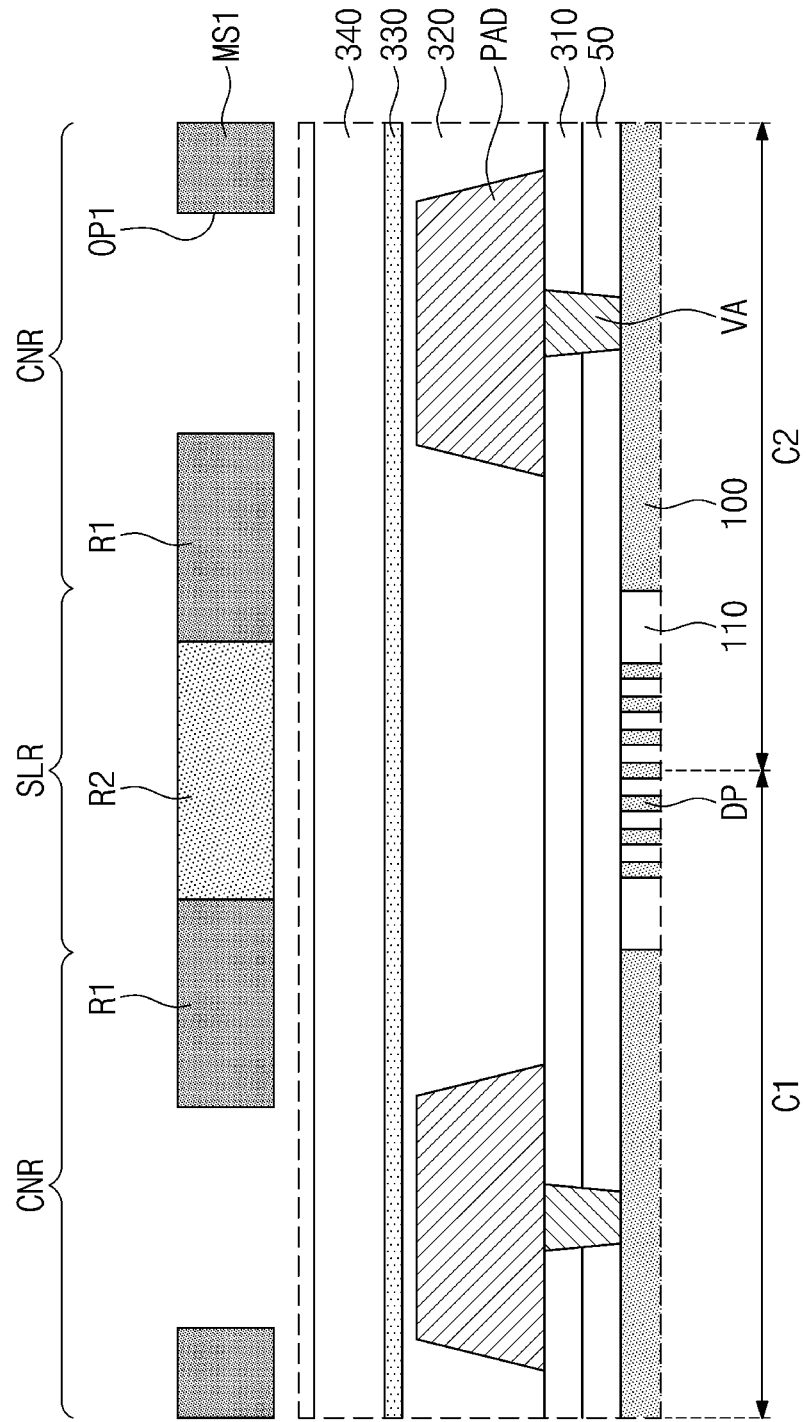

Referring to FIG. 8B, a first mask pattern MS1 including a first opening OP1 may be disposed on the third passivation layer 340. The first opening OP1 may define a region in which the pad opening OP of FIG. 4 is to be formed. The first mask pattern MS1 may include a first region R1 and a second region R2 excluding the first opening OP1. For example, when light is irradiated, the first region R1 may hardly transmit light, and the second region R2 may transmit only a certain amount of light. In detail, the second region R2 which is a phase shift mask (PSM) may reduce an intensity (contrast) of light passing through the second region R2. That is, in the mask pattern MS1, the first region R1 may transmit less light than the second region R2 that vertically overlaps the scribe lane region SLR, and the second region R2 may transmit less light than the opening OP1.

Figure 8C:
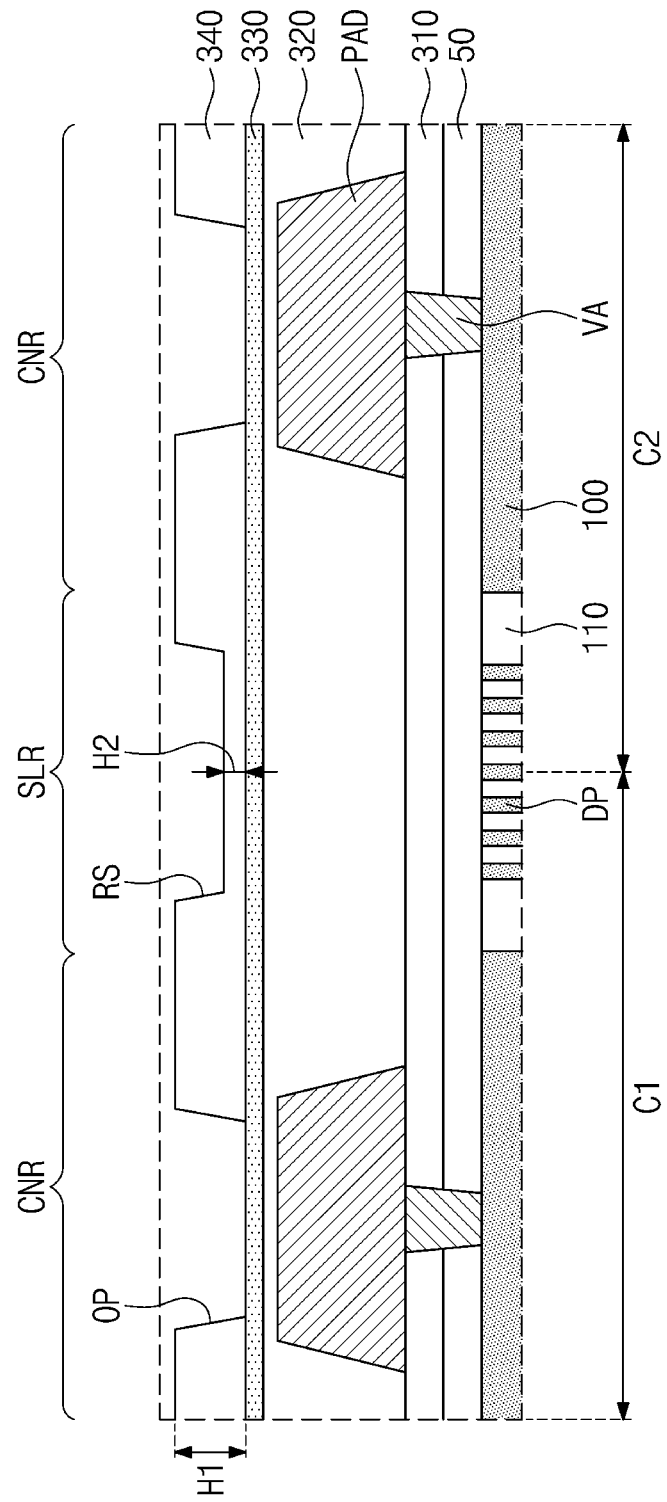

Referring to FIGS. 8B and 8C, a developing process of the third passivation layer 340 may be performed using the first mask pattern MS1. As a result of the developing process, a portion of the third passivation layer 340 that vertically overlaps the first opening OP1 of the first mask pattern MS1 may be removed to form the pad opening OP. A portion of the third passivation layer 340 that vertically overlaps the second region R2 of the first mask pattern MS2 may be partially removed to form a recess RS. A portion of the third passivation layer 340 that vertically overlaps the first region R1 of the first mask pattern MS1 may not be substantially removed. A curing process may then proceed. A first thickness H1 of the third passivation layer 340 in the cell array region CAR and the connection region CNR may be greater than a second thickness H2 of the third passivation layer 340 in the scribe lane region SLR.

Figure 8D:
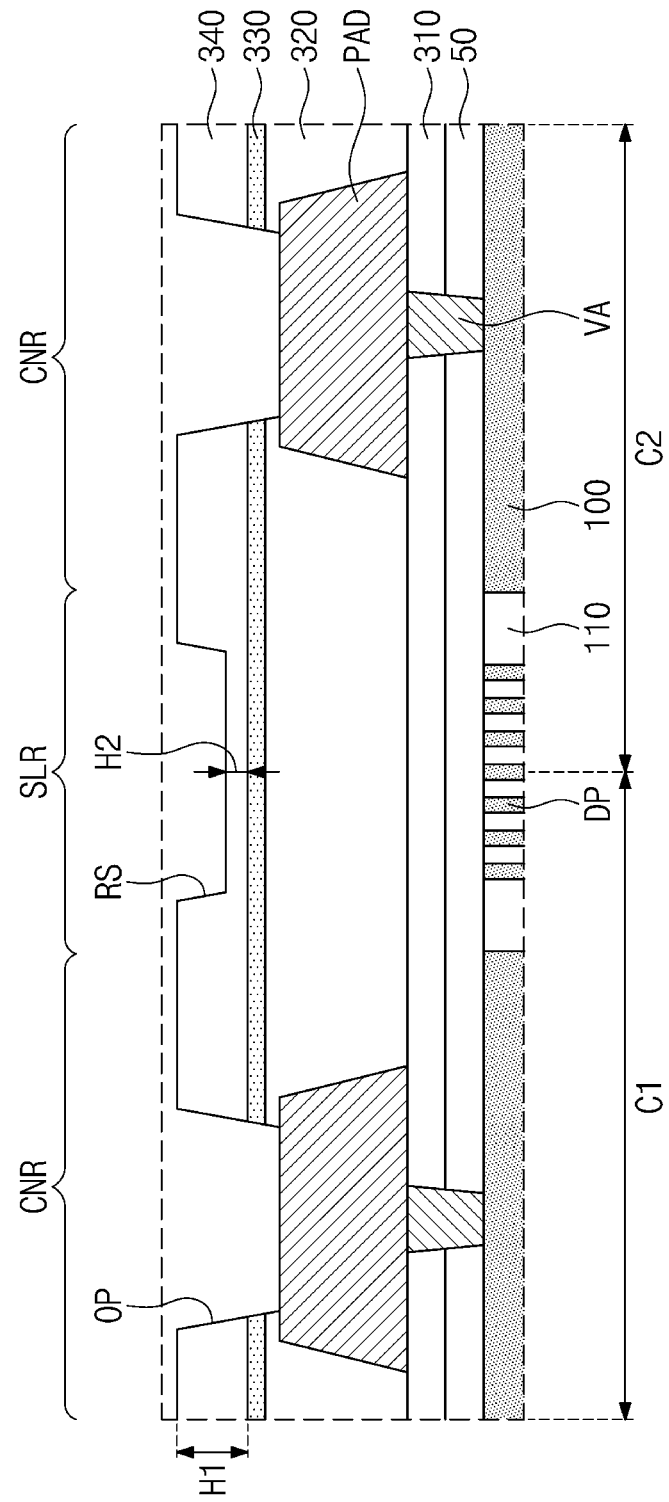

Referring to FIG. 8D, the second passivation layer 330 and the first passivation layer 320 may be sequentially etched using the third passivation layer 340 as an etch mask. As a result, the pad opening OP may expose the upper surface of the external connection pad PAD. During this process, the upper surface of the second passivation layer 330 of the scribe lane region SLR may not be exposed.

Figure 8E:
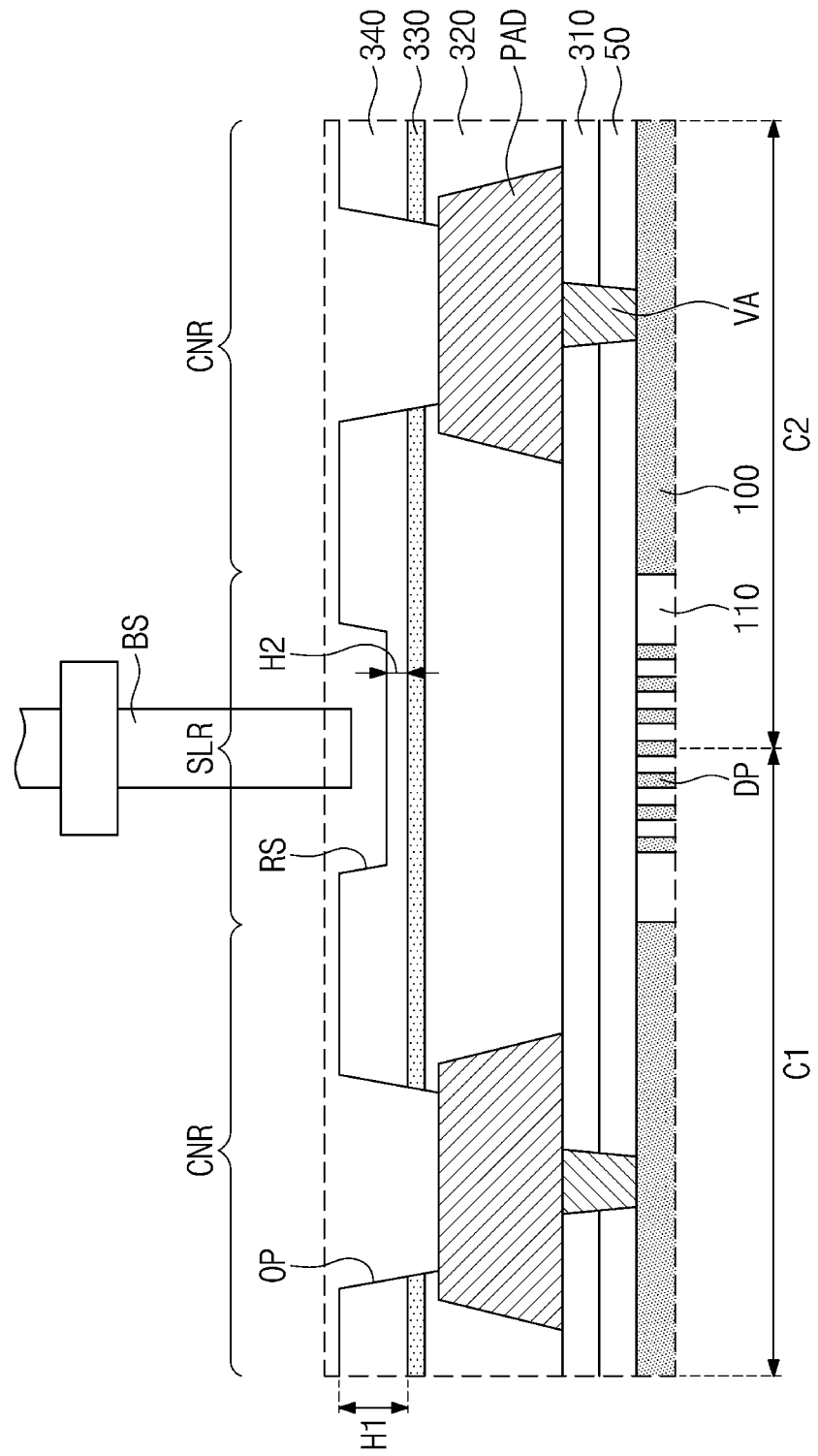

Referring to FIG. 8E, a sawing process may be performed on the first wafer WF1 and the second wafer WF2 of FIG. 6 in the scribe lane region SLR to singulate the semiconductor devices. As an example, a blade sawing (BS) process may be performed.

Figure 8F:
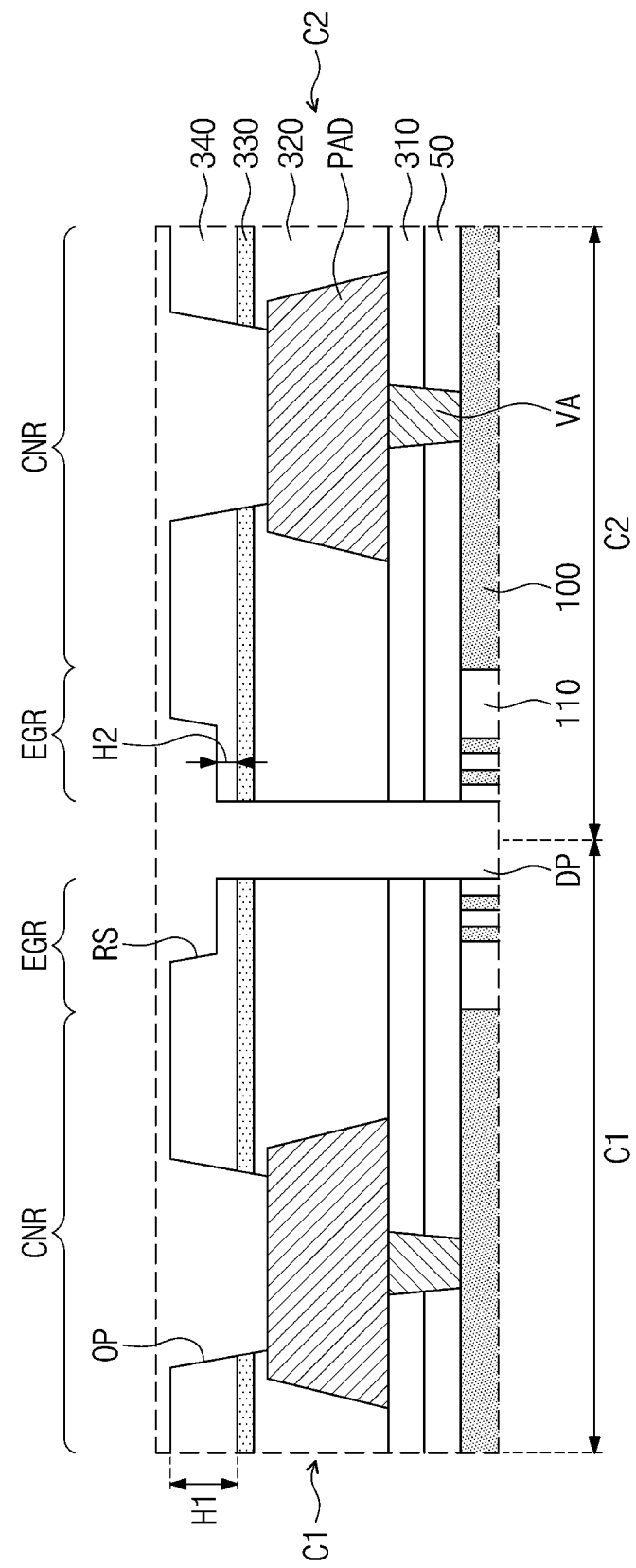

As a result, as shown in FIG. 8F, the first preliminary region C1 and the second preliminary region C2 of the first wafer WF1 and the second wafer WF2 may form the first semiconductor device and the second semiconductor device, respectively.

Figure 9A:
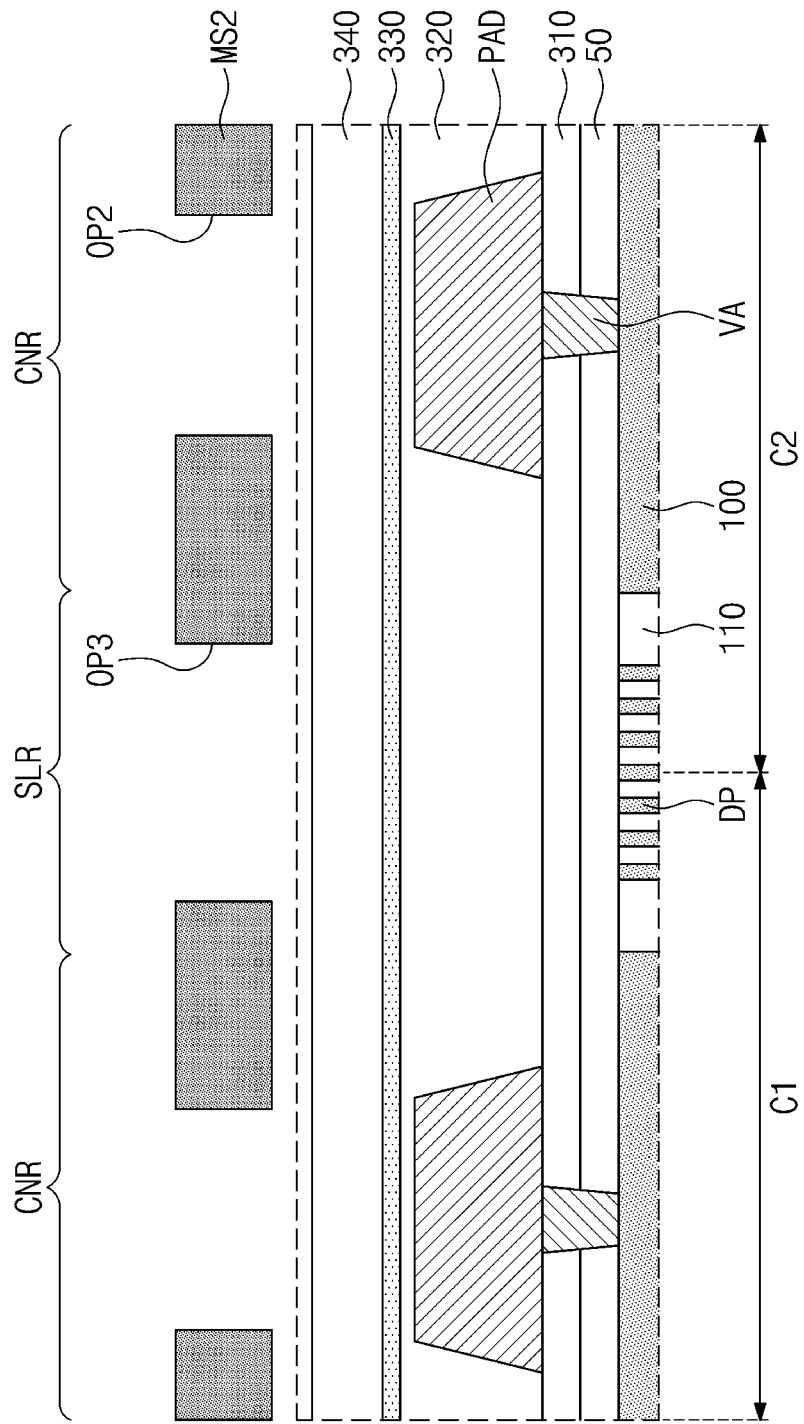
FIGS. 9A, 9B, and 9C are process enlarged views illustrating a process of manufacturing a semiconductor device according to a comparative example.
Figure 9B:
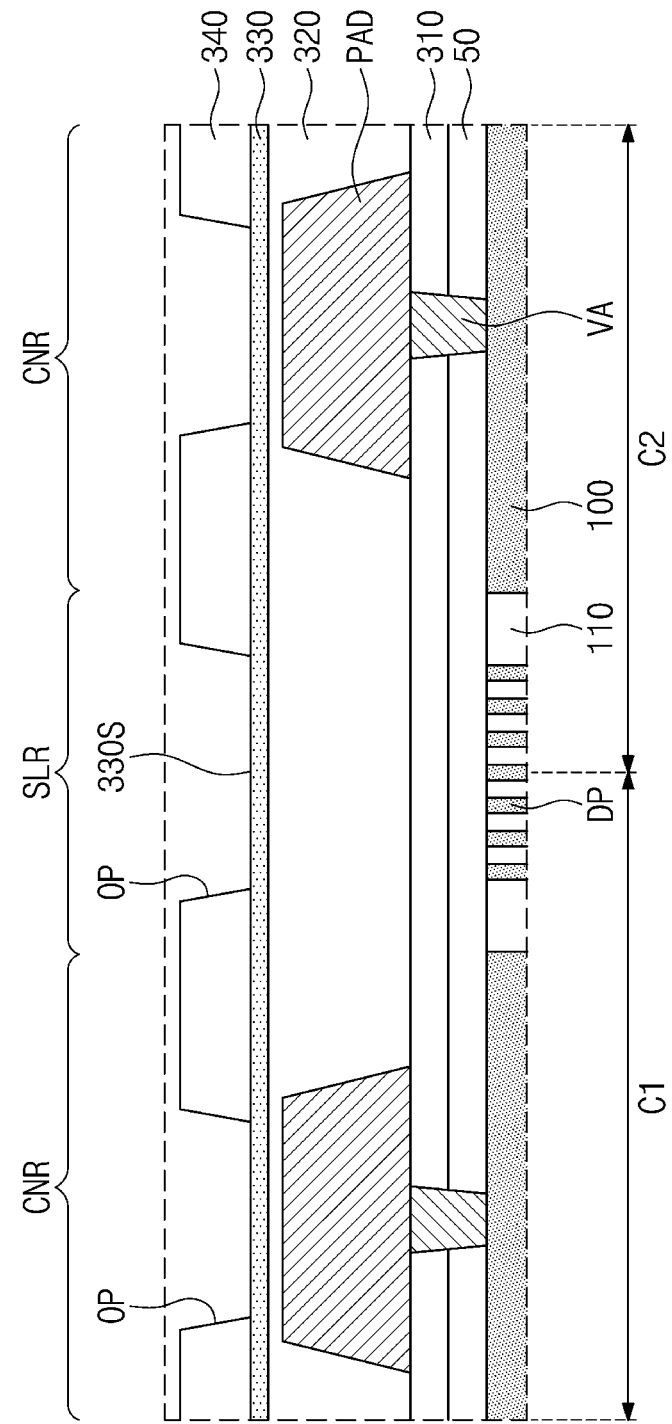
Figure 9C:
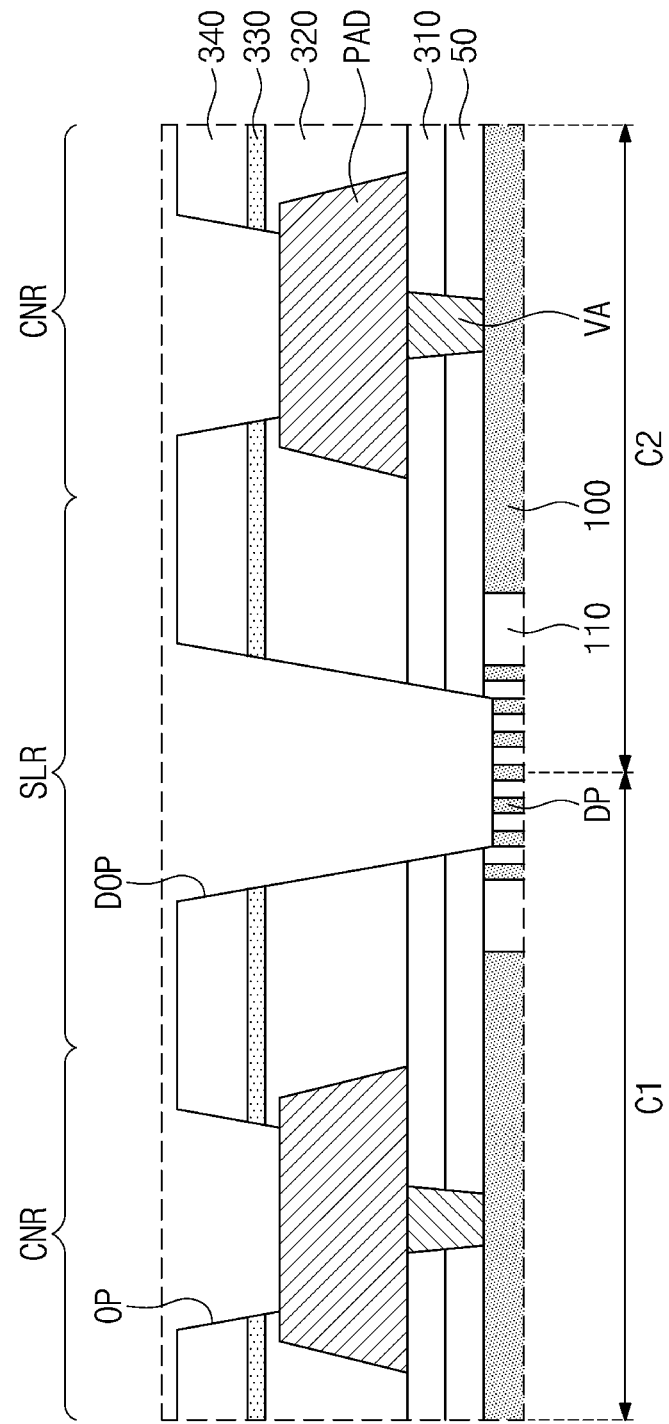

FIGS. 9A to 9C are process enlarged views illustrating a process of manufacturing a semiconductor device according to a comparative example.

Referring to FIG. 9A, after the third passivation layer 340 is formed, a second mask pattern M2 may be disposed on the third passivation layer 340. The second mask pattern MS2 may include a second opening OP2 defining the pad opening OP and a third opening OP3 vertically overlapping the scribe lane region SLR. Light may hardly pass through portions of the second mask pattern MS2 except for the second opening OP2 and the third opening OP3.

Referring to FIGS. 9A and 9B, the third passivation layer 340 may be exposed on or by the second mask pattern MS2. Subsequently, a process of developing and curing the third passivation layer 340 may be performed. Referring to FIG. 9B, an upper surface 330S of the second passivation layer 330 vertically overlapping the scribe lane region SLR may be exposed. Similarly, a portion of the upper of the second passivation layer 330 vertically overlapping the external connection pad PAD of the connection region CNR may also be exposed.

Referring to FIGS. 9B and 9C, the second passivation layer 330 and the first passivation layer 320 may be sequentially etched using the third passivation layer 340 as an etch mask. In the connection region CNR, the external connection pad PAD including a metal may prevent additional etching. In the scribe lane region SLR, the second lower insulating layer 310 and the first lower insulating layer 50 may be additionally etched and a deep opening DOP exposing the dummy patterns DP may be formed. In this process, the dummy patterns DP may also be partially etched. During the etching process of the dummy pattern DP, impurities such as polysilicon may be generated. This may cause arcing in a subsequent process, and may reduce reliability of the semiconductor device manufactured when an etch chamber is contaminated.

In embodiments of the inventive concept, the third passivation layer 340 on or overlapping the scribe lane region SLR may remain to prevent etching of the dummy pattern DP, and thus the reliability of the semiconductor device may be increased compared to that of the comparative example.

According to another comparative example, to prevent etching of the dummy pattern DP, the third passivation layer 340 on the scribe lane region SLR may remain as thick as the third passivation layer 340 in the cell array region CAR and the connection region CNR. In this case, when the sawing process is performed as shown in FIG. 8E, as the third passivation layer 340 is rolled into a rotating blade together, a problem such as chipping may occur. In embodiments of the inventive concept, by reducing the thickness of the third passivation layer 340 of the scribe lane region SLR, a problem such as chipping may be reduced or prevented. In addition, the process of reducing the thickness of the third passivation layer 340 is performed through one exposure, development, and curing process using PSM, and thus an additional process is unnecessary, thereby reducing cost and increasing efficiency.

In embodiments of the inventive concept, the photosensitive insulating layer provided in the scribe lane region of the wafer may remain in the process of forming the opening to expose the external connection pad (also referred to as an opening process). As a result, it is possible to prevent the dummy pattern from being damaged during the opening process of the external connection pad. In addition, by reducing the thickness of the photosensitive insulating layer, the chipping phenomenon may be reduced or prevented in the sawing process. As a result, the reliability of the semiconductor device may be increased.

While embodiments are described above, a person skilled in the art may understand that many modifications and variations are made without departing from the scope of the inventive concept defined in the following claims. Accordingly, the example embodiments of the inventive concept should be considered in all respects as illustrative and not restrictive, with the scope of the inventive concept being indicated by the appended claims.

What is claimed is:

1. A semiconductor device comprising:
   a peripheral circuit structure comprising peripheral circuits on a semiconductor substrate and first bonding pads electrically connected to the peripheral circuits; and
   a cell array structure comprising memory cells arranged three-dimensionally on a semiconductor layer and second bonding pads electrically connected to the memory cells and bonded to the first bonding pads,
   wherein the cell array structure further comprises:
   a stacked structure comprising insulating layers and electrodes alternately stacked on a first surface of the semiconductor layer;
   an external connection pad on a lower insulating layer that extends on a second surface of the semiconductor layer;
   a dummy pattern positioned at a same level as the semiconductor layer relative to the semiconductor substrate; and
   a photosensitive insulating layer on the semiconductor layer and the dummy pattern,
   wherein a first thickness of a portion of the photosensitive insulating layer vertically overlapping the external connection pad is greater than a second thickness of another portion of the photosensitive insulating layer vertically overlapping the dummy pattern.

2. The semiconductor device of claim 1, wherein the dummy pattern comprises a same material as the semiconductor layer and is electrically isolated therefrom, and
   wherein a thickness of the dummy pattern is substantially the same as a thickness of the semiconductor layer.

3. The semiconductor device of claim 1, wherein the first thickness is greater than the second thickness by at least four times or more.

4. The semiconductor device of claim 1, wherein the first thickness is about 40,000 Angstroms (Å) to about 55,000 Å, and the second thickness is greater than 0 Å and less than about 10,000 Å.

5. The semiconductor device of claim 1, further comprising:
   a first passivation layer and a second passivation layer sequentially stacked between the lower insulating layer and the photosensitive insulating layer,
   wherein the first passivation layer comprises a same insulating material as the lower insulating layer, and
   wherein the second passivation layer comprises a different insulating material than the first passivation layer and the lower insulating layer.

6. The semiconductor device of claim 5, wherein the first passivation layer comprises a silicon oxide layer, and wherein the second passivation layer comprises a silicon nitride layer.

7. The semiconductor device of claim 1, wherein the dummy pattern comprises a same material as the semiconductor layer and is electrically isolated therefrom, and
   wherein a first width of the dummy pattern in a first direction parallel to an upper surface of the semiconductor substrate is smaller than a second width of the semiconductor layer in the first direction.

8. The semiconductor device of claim 1, further comprising:
   an upper insulating layer between the lower insulating layer and the photosensitive insulating layer, wherein the photosensitive insulating layer and the upper insulating layer include a pad opening therein exposing an upper surface of the external connection pad, and wherein an upper surface of the dummy pattern is covered by the upper insulating layer and the photosensitive insulating layer.

9. The semiconductor device of claim 1, wherein the photosensitive insulating layer comprises a step difference between the portion thereof that is vertically overlapping the external connection pad and the another portion thereof that is vertically overlapping the dummy pattern.

10. The semiconductor device of claim 1, wherein the cell array structure comprises a cell array region, an edge region, and a connection region therebetween, and further comprising:

cell contact plugs respectively connected to ends of the electrodes in the connection region, wherein the dummy pattern is in the edge region.

11. A semiconductor device comprising:

a peripheral circuit structure comprising peripheral circuits on a semiconductor substrate and first bonding pads electrically connected to the peripheral circuits; and a cell array structure comprising memory cells arranged three-dimensionally on a semiconductor layer and second bonding pads electrically connected to the memory cells and bonded to the first bonding pads, wherein the cell array structure further comprises:

a stacked structure comprising insulating layers and electrodes alternately stacked on a first surface of the semiconductor layer;

an external connection pad on a lower insulating layer that extends on a second surface of the semiconductor layer;

a dummy pattern positioned at a same level as the semiconductor layer relative to the semiconductor substrate; and an upper insulating layer on the semiconductor layer and the dummy pattern, wherein a first distance from the second surface of the semiconductor layer to an upper surface of the upper insulating layer is greater than a second distance from a surface of the dummy pattern to the upper surface of the upper insulating layer.

12. The semiconductor device of claim 11, wherein the first distance is greater than the second distance by at least about 30,000 Å.

13. The semiconductor device of claim 11, wherein the upper insulating layer comprises photo sensitive polyimide (PSPI).

14. The semiconductor device of claim 11, wherein the dummy pattern comprises a same material as the semiconductor layer and is electrically isolated therefrom, and wherein a thickness of the dummy pattern is substantially the same as a thickness of the semiconductor layer.

15. The semiconductor device of claim 14, wherein the dummy pattern and the semiconductor layer comprise polysilicon.

16. The semiconductor device of claim 11, wherein the upper insulating layer is a first upper insulating layer, and further comprising:

a second upper insulating layer and a third upper insulating layer between the lower insulating layer and the first upper insulating layer, wherein the second upper insulating layer extends on an upper surface and a side surface of the external connection pad, and wherein the third upper insulating layer is spaced apart from the external connection pad with the second upper insulating layer interposed therebetween.

17. The semiconductor device of claim 16, wherein the second upper insulating layer comprises a silicon oxide layer, and wherein the third upper insulating layer comprises a silicon nitride layer.

18. A semiconductor device comprising:

a peripheral circuit structure comprising peripheral circuits on a semiconductor substrate and first bonding pads electrically connected to the peripheral circuits; and a cell array structure comprising memory cells arranged three-dimensionally on a semiconductor layer and second bonding pads electrically connected to the memory cells and bonded to the first bonding pads, wherein the cell array structure further comprises:

a stacked structure comprising insulating layers and electrodes alternately stacked on a first surface of the semiconductor layer;

an external connection pad on a lower insulating layer that extends on a second surface of the semiconductor layer;

a dummy pattern at a same level as the semiconductor layer relative to the semiconductor substrate; and a first buffer layer, a second buffer layer, and a third buffer layer sequentially stacked on the semiconductor layer and the dummy pattern, wherein the first buffer layer, the second buffer layer, and the third buffer layer include a pad opening therein exposing an upper surface of the external connection pad, wherein the third buffer layer comprises a recess in a portion thereof vertically overlapping the dummy pattern, and wherein a depth of the recess is smaller than a depth of the pad opening, relative to a surface of the third buffer layer.

19. The semiconductor device of claim 18, wherein the first buffer layer comprises a silicon oxide layer, wherein the second buffer layer comprises a silicon nitride layer, and wherein the third buffer layer comprises an insulating photosensitive material.

20. The semiconductor device of claim 18, wherein the dummy pattern and the semiconductor layer comprise polysilicon and are electrically isolated from one another, and wherein a first width of the dummy pattern in a first direction parallel to an upper surface of the semiconductor substrate is smaller than a second width of the semiconductor layer in the first direction.

* * * * *